United States Patent
Xu

(10) Patent No.: US 9,985,132 B2
(45) Date of Patent: May 29, 2018

(54) SEMICONDUCTOR DEVICE AND FABRICATING METHOD OF A GATE WITH AN EPITAXIAL LAYER

(71) Applicants: Semiconductor Manufacturing International (Beijing) Corporation, Beijing (CN); Semiconductor Manufacturing International (Shanghai) Corporation, Shanghai (CN)

(72) Inventor: Chang Chun Xu, Shanghai (CN)

(73) Assignees: SEMICONDUCTOR MANUFACTURING INTERNATIONAL (BEIJING) CORPORAITON, Beijing (CN); SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days. days.

(21) Appl. No.: 15/343,433

(22) Filed: Nov. 4, 2016

(65) Prior Publication Data
US 2017/0125589 A1 May 4, 2017

(30) Foreign Application Priority Data
Nov. 4, 2015 (CN) .......................... 2015 1 0742087

(51) Int. Cl.
*H01L 21/3065* (2006.01)
*H01L 29/78* (2006.01)
(Continued)

(52) U.S. Cl.
CPC ...... *H01L 29/7848* (2013.01); *H01L 21/0262* (2013.01); *H01L 21/02529* (2013.01);
(Continued)

(58) Field of Classification Search
CPC ........... H01L 29/7848; H01L 21/02529; H01L 21/02532; H01L 21/02546; H01L 21/0262;
(Continued)

(56) References Cited

U.S. PATENT DOCUMENTS

| 8,895,396 B1 | 11/2014 | Fu et al. |
| 2006/0105511 A1* | 5/2006 | Yang .................. H01L 29/6659 438/197 |

(Continued)

FOREIGN PATENT DOCUMENTS

EP 1677360 A2 7/2006

*Primary Examiner* — Peter Bradford
(74) *Attorney, Agent, or Firm* — Anova Law Group, PLLC

(57) ABSTRACT

In some embodiments, a semiconductor device and a fabricating method thereof are provided. The method can comprise: providing a semiconductor substrate; forming a gate structure on the semiconductor substrate; forming an epitaxial substrate layer on the semiconductor substrate on both sides of the gate structure; forming a hard mask layer conformally covering the epitaxial substrate layer, the gate structure and the semiconductor substrate; etching the hard mask layer to form a hard mask sidewall layer on sidewall surfaces of the gate structure and on the epitaxial substrate layer; using the hard mask sidewall layer as a mask to etch the epitaxial substrate layer and the semiconductor substrate to form trenches on both sides of the gate structure; and forming a stress layer in the trenches.

15 Claims, 10 Drawing Sheets

(51) Int. Cl.
| | |
|---|---|
| *H01L 29/66* | (2006.01) |
| *H01L 29/08* | (2006.01) |
| *H01L 21/02* | (2006.01) |
| *H01L 21/308* | (2006.01) |
| *H01L 29/161* | (2006.01) |
| *H01L 29/165* | (2006.01) |
| *H01L 21/311* | (2006.01) |
| *H01L 21/306* | (2006.01) |
| *H01L 29/06* | (2006.01) |
| *H01L 27/092* | (2006.01) |
| *H01L 21/8238* | (2006.01) |

(52) U.S. Cl.
CPC .. *H01L 21/02532* (2013.01); *H01L 21/02546* (2013.01); *H01L 21/3065* (2013.01); *H01L 21/3081* (2013.01); *H01L 21/3085* (2013.01); *H01L 21/3086* (2013.01); *H01L 21/30608* (2013.01); *H01L 21/31116* (2013.01); *H01L 21/823814* (2013.01); *H01L 21/823821* (2013.01); *H01L 27/0924* (2013.01); *H01L 29/0653* (2013.01); *H01L 29/0847* (2013.01); *H01L 29/161* (2013.01); *H01L 29/165* (2013.01); *H01L 29/66628* (2013.01); *H01L 29/66636* (2013.01)

(58) Field of Classification Search
CPC ........... H01L 21/30608; H01L 21/3065; H01L 21/3081; H01L 21/3085; H01L 21/3086; H01L 21/31116; H01L 21/823814; H01L 21/823821; H01L 27/0924; H01L 2/0653; H01L 29/0847

See application file for complete search history.

(56) References Cited

U.S. PATENT DOCUMENTS

| | | | |
|---|---|---|---|
| 2007/0023847 A1* | 2/2007 | Rhee | H01L 29/665 257/408 |
| 2009/0218619 A1* | 9/2009 | Hebert | H01L 29/0619 257/332 |
| 2010/0167505 A1* | 7/2010 | Chew | H01L 21/02532 438/503 |
| 2012/0273798 A1 | 11/2012 | Alptekin et al. | |
| 2013/0119370 A1 | 5/2013 | Wu et al. | |
| 2013/0285146 A1* | 10/2013 | Tung | H01L 21/823807 257/368 |
| 2014/0084369 A1* | 3/2014 | Murthy | H01L 21/02057 257/344 |
| 2014/0191298 A1* | 7/2014 | Chen | H01L 29/401 257/288 |
| 2014/0295629 A1* | 10/2014 | Wen | H01L 21/823814 438/213 |
| 2014/0346600 A1* | 11/2014 | Cheng | H01L 29/7849 257/347 |
| 2015/0021688 A1 | 1/2015 | Sung et al. | |

\* cited by examiner

SEMICONDUCTOR DEVICE AND FABRICATING METHOD OF A GATE WITH AN EPITAXIAL LAYER

CROSS-REFERENCES TO RELATED APPLICATIONS

This application claims the priority of Chinese patent application No. 201510742087.4, filed on Nov. 4, 2015, the entire content of which is incorporated herein by reference.

TECHNICAL FIELD

The present disclosure generally relates to the field of semiconductor technologies and, more particularly, relates to a semiconductor device and a method for fabricating the semiconductor device.

BACKGROUND

In the semiconductor manufacturing, with the development of Ultra-large-scale integrated circuits (VLSI), the characteristics sizes of the integrated circuits are continuously decreasing. Since the transistor size is getting smaller and smaller, and the operating speed is getting faster and faster, the transistor performance requirement in the semiconductor manufacturing process is also getting higher and higher. Carrier mobility is one of the key factors that affects the transistor performance. As such, effectively improving the carrier mobility becomes one of the priorities in the transistor device manufacturing field.

In the fabrication of complementary metal-oxide-semiconductor field effect transistor (CMOS) devices, P-type metal oxide semiconductor (PMOS) field effect transistors and N-type metal oxide semiconductor (NMOS) field effect transistors are generally processed separately. For example, in the manufacturing process for forming a PMOS device, epitaxial growth of germanium silicon (EPI SiGe) process can be used for forming a silicon germanium (SiGe) stress layer in the source and drain (S/D) region of the PMOS device. The SiGe stress layer can apply an appropriate compressive stress to the channel region to improve the hole mobility. Therefore, EPI SiGe process is one important technique in the PMOS device stress engineering. As another example, in the manufacturing process for forming an NMOS device, a stress layer can be formed to provide an appropriate tensile stress to improve the electron mobility.

However, it is hard to improve the performance of the PMOS device formed by the existing manufacturing processes. Further, the processing window is very small, and the product yield is also limited.

BRIEF SUMMARY

In accordance with some embodiments of the disclosed subject matter, a semiconductor device and a fabricating method thereof is provided.

One aspect of the disclosed subject matter provides a method for forming a semiconductor device A method for fabricating a semiconductor device, comprising: providing a semiconductor substrate; forming a gate structure on the semiconductor substrate; forming an epitaxial substrate layer on the semiconductor substrate on both sides of the gate structure; forming a hard mask layer conformally covering the epitaxial substrate layer, the gate structure and the semiconductor substrate; etching the hard mask layer to form a hard mask sidewall layer on sidewall surfaces of the gate structure and on the epitaxial substrate layer; using the hard mask sidewall layer as a mask to etch the epitaxial substrate layer and the semiconductor substrate to form trenches on both sides of the gate structure; and forming a stress layer in the trenches.

In some embodiments, the semiconductor device is a PMOS; and the trenches have a Sigma shape.

In some embodiments, a material of the epitaxial substrate layer is one of silicon, germanium, silicon germanium, silicon carbide, gallium arsenide, and indium gallium.

In some embodiments, a process for forming the epitaxial substrate layer is an epitaxial chemical vapor deposition growth process.

In some embodiments, the epitaxial chemical vapor deposition growth process includes following parameters: a processing temperature in a range from 500° C. to 950° C.; a processing time in a range from 10 seconds to 11,000 seconds; a reaction chamber pressure in a range from 5 Torr to 1,000 Torr; a pretreatment gas, for epitaxially forming the epitaxial substrate layer, including hydrogen gas; and a reaction gas, for epitaxially forming the epitaxial substrate layer, including one of hydrogen chloride, dichlorosilane, silane, and a combination thereof.

In some embodiments, a thickness of the epitaxial substrate layer is in a range from 10 Å to 1,000 Å.

In some embodiments, a material of the hard mask layer is silicon nitride.

In some embodiments, a thickness of the hard mask layer is in a range from 20 Å to 300 Å.

In some embodiments, a material of the stress layer is a germanium silicon material, or a boron-containing germanium silicon material.

In some embodiments, a process for forming the stress layer is an epitaxial chemical vapor deposition growth process.

In some embodiments, the epitaxial chemical vapor deposition growth process includes following parameters: a processing temperature in a range from 500° C. to 950° C.; a processing time in a range from 10 seconds to 11,000 seconds; a reaction chamber pressure in a range from 5 Torr to 1,000 Torr; a pretreatment gas, for epitaxially forming the stress layer, including hydrogen; and a reaction gas, for epitaxially forming the stress layer, including one of hydrogen chloride, dichlorosilane, silane, and a combination thereof.

In some embodiments, a thickness of the stress layer is in a range from 200 Å to 1,000 Å.

In some embodiments, etching the epitaxial substrate layer and the semiconductor substrate to form trenches comprises: using the hard mask sidewall layer as a mask, performing a first etching process to sequentially etch the epitaxial substrate layer and the semiconductor substrate to form initial openings in the epitaxial substrate layer and the semiconductor substrate on both sides of the gate structure; and performing a second etching process to etch the initial openings to form the trenches in the epitaxial substrate layer and in the semiconductor substrate on both sides of the gate structure.

In some embodiments, the first etching process is a plasma dry etching process; and the second etching process is an anisotropic wet etching process.

Another aspect of the disclosed subject matter provides a semiconductor device, comprising: a semiconductor substrate; a gate structure on the semiconductor substrate; an epitaxial substrate layer on the semiconductor substrate on both sides of the gate structure; a hard mask sidewall layer on sidewall surfaces of the gate structure, wherein the hard mask sidewall layer is located above the epitaxial substrate layer; and a stress layer in the epitaxial substrate layer and the semiconductor substrate.

In some embodiments, the semiconductor device further comprises isolation structures in the semiconductor substrate, wherein the stress layer is located between the isolation structures and the gate structure.

In some embodiments, a material of the epitaxial substrate layer is one of silicon, germanium, silicon germanium, silicon carbide, gallium arsenide, and indium gallium; and a material of the stress layer is a germanium silicon material, or a boron-containing germanium silicon material.

In some embodiments, a thickness of the epitaxial substrate layer is in a range from 10 Å to 1,000 Å.

In some embodiments, a thickness of the stress layer is in a range from 200 Å to 1,000 Å.

In some embodiments, a material of the hard mask layer is silicon nitride.

Other aspects of the disclosed subject matter can be understood by those skilled in the art in light of the description, the claims, and the drawings of the present disclosure.

BRIEF DESCRIPTION OF THE DRAWINGS

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of the present disclosure.

DETAILED DESCRIPTION

Figure 1:
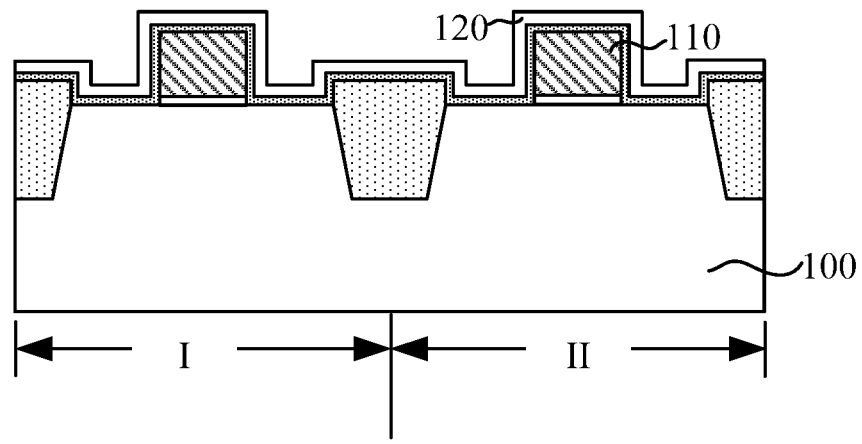
FIGS. 1-4 illustrate cross sectional structures of a semiconductor device corresponding to certain stages of an existing fabricating process.

Various objects, features, and advantages of the disclosed subject matter can be more fully appreciated with reference to the following detailed description of the disclosed subject matter when considered in connection with the following drawings, in which like reference numerals identify like elements. It should be noted that the following drawings are merely examples for illustrative purposes according to various disclosed embodiments and are not intended to limit the scope of one disclosure.

It is apparent that the described embodiments are some but not all of the embodiments of the present invention. Based on the disclosed embodiments, persons of ordinary skill in the art may derive other embodiments consistent with the present disclosure, all of which are within the scope of the present invention.

Referring to FIGS. 1-4, cross sectional structures of a semiconductor device corresponding to certain stages of an existing fabricating process are shown. As illustrated, the existing fabricating process can include the following steps.

Firstly, as shown in FIG. 1, a semiconductor substrate 100 can be provided. The semiconductor substrate 100 can include an NMOS region I and a PMOS region II. Gate structures 110 can be formed on the surfaces of the semiconductor substrate 100 in the NMOS region I and the PMOS region II respectively. A dielectric layer 120 can be formed conformally covering the semiconductor substrate 100 and the gate structures 110.

Figure 2:
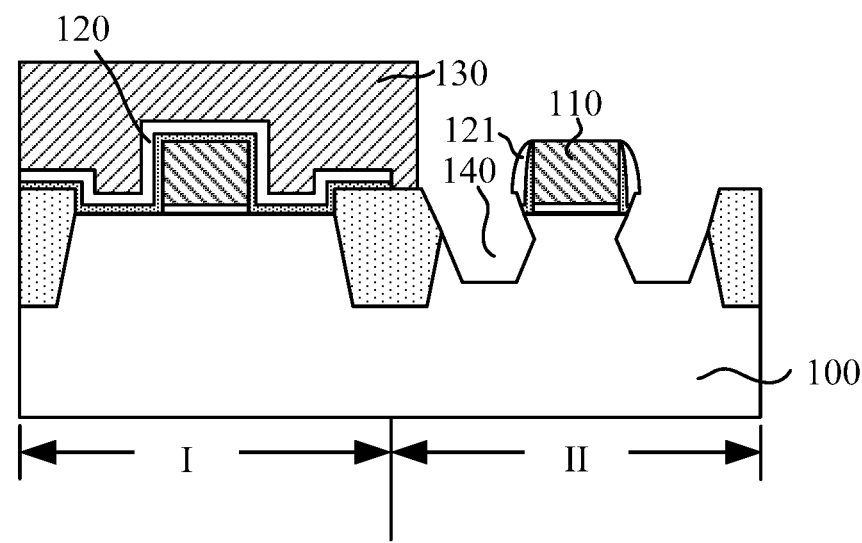

Next, as shown in FIG. 2, a first patterned mask layer 130 covering the NMOS region I can be formed on the semiconductor substrate 100. By using the first patterned mask layer 130 as a mask, an etching process can be performed to form trenches 140 in the PMOS region II. The trenches 140 can be located in the semiconductor substrate 100 on both sides of the gate structure 110 in the PMOS region II. The trenches 140 can have a Sigma "Σ" shape. Sidewalls 121 can be formed on the sidewall surfaces of the gate structure 110 in the PMOS region II.

Figure 3:
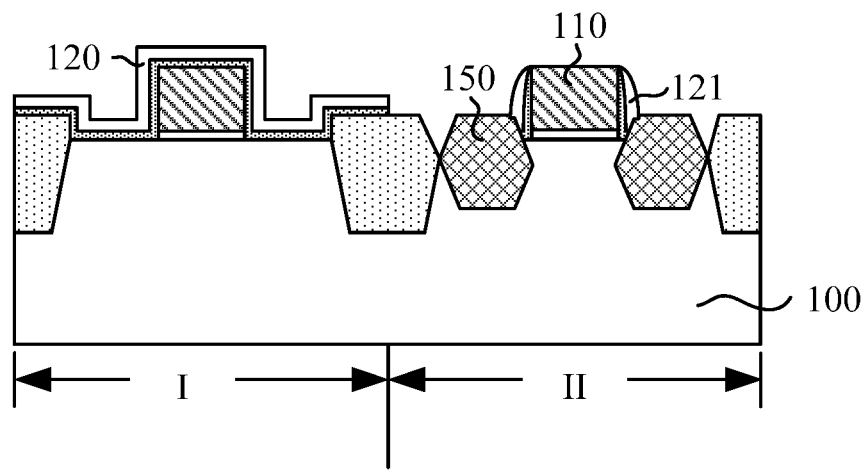

Then, as shown in FIG. 3, the trenches 140 can be filled with a stress layer 150. The first patterned mask layer 130 can be removed.

Figure 4:
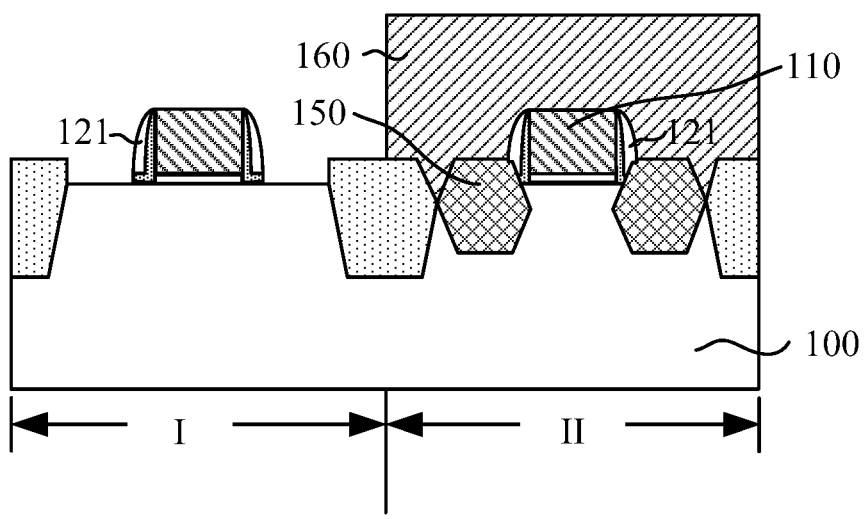

Next, as shown in FIG. 4, a second patterned mask layer 160 covering the PMOS region II can be formed on the semiconductor substrate 100. By using the second patterned mask layer 160 as a mask, another etching process can be performed to etch the surface of semiconductor substrate 100 and the dielectric layer 120 at the top of the gate structure 110 in the NMOS region I. Sidewalls 121 can be formed on the sidewall surfaces of the gate structure 110 in the NMOS region I. A subsequent ion implantation process can be used to form the semiconductor device.

In the existing fabricating process, the Sigma shaped trenches 140 are formed by etching the dielectric layer 120 (shown in FIG. 1) and the semiconductor substrate 100 in the PMOS region II. As shown in FIG. 2, the Sigma shaped trenches 140 have a relatively large opening size at the top of the trenches 140. Accordingly, an angle between the sidewall of the trench 140 close to the bottom semiconductor substrate 100 and the surface of the semiconductor substrate 100 is relatively large. Therefore, during the etching process to form the Sigma shaped trenches 140 in the semiconductor substrate 100, a loss of the oxide layer near the bottom of the gate structure 110 can be easily caused, resulting in a short circuit between the gate structure 110 and the source and drain regions (not shown in the figures), thereby reducing the performance of the semiconductor device.

In order to solve the above-discussed technical problems, the disclosed subject matter provides a semiconductor device and a fabricating method thereof. In the following, details of the semiconductor device and the fabricating method are described in connection with the drawings.

Figure 18:
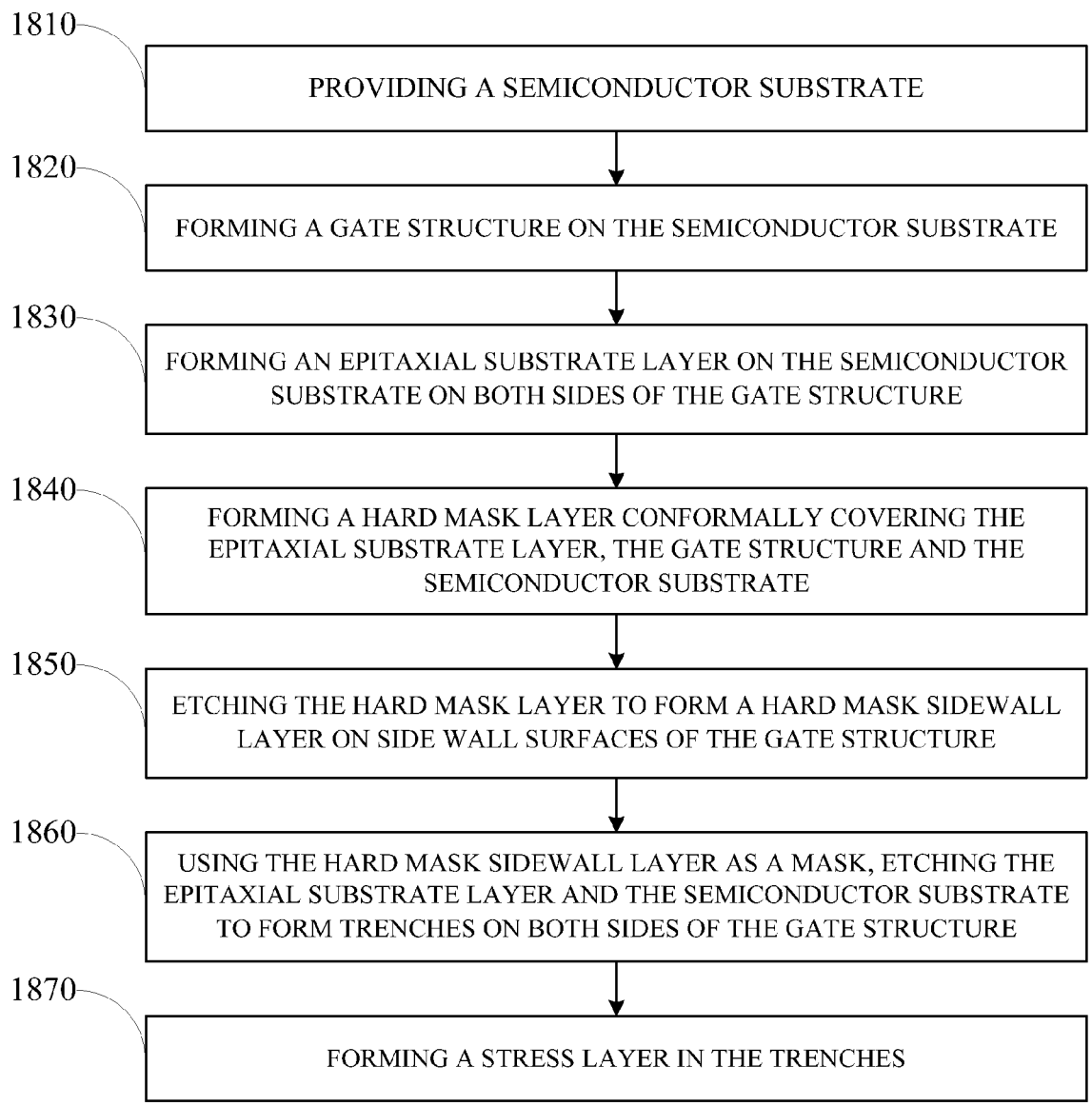
FIG. 18 illustrates a flow chart of an exemplary process for fabricating a semiconductor device in accordance with some embodiments of the disclosed subject matter.

Referring to FIG. 18, a flow chart of an exemplary process for fabricating a semiconductor device is shown in accordance with some embodiments of the disclosed subject matter. At step 1810, a semiconductor substrate can be provided. At step 1820, gate structures can be formed on the semiconductor substrate. At step 1830, an epitaxial substrate layer can be formed on the semiconductor substrate on both sides of a gate structure. At step 1840, a hard mask layer can be formed conformally covering the epitaxial substrate layer, the gate structure and the semiconductor substrate. At step 1850, the hard mask layer can be etched to form a hard mask sidewall layer on sidewalls of the gate structure. At step 1860, using the hard mask sidewall layer as a mask, the epitaxial substrate layer and the semiconductor substrate can be etched to form trenches on both sides of the gate structure. At step 1870, a stress layer can be formed in the trenches.

In the disclosed fabricating method, before forming the trenches, an epitaxial substrate layer can be formed on the semiconductor substrate on both sides of one gate structure. The epitaxial substrate layer can be used as a part of the substrate of the PMOS device such that the substrate of the PMOS device can be raised up. By adjusting the thickness of the epitaxial substrate layer, the height of the substrate of the PMOS device to be raised can be controlled.

Further, a hard mask sidewall layer can be formed on the sidewall surfaces of the one gate structure. By using the hard mask sidewall layer as a mask, the epitaxial substrate layer and the semiconductor substrate can be etched to form Sigma shaped trenches on both sides of the one gate structure.

During the etching process for forming the trenches, the epitaxial substrate layer under the hard mask sidewall layer can be retained, so that the opening size of the top portion of the formed trenches can be relatively small. Accordingly, the angles between the sidewalls of the trenches close to the epitaxial substrate layer and the substrate surface can be relatively small. As such, the etching process for forming the Sigma shaped trenches can cause less loss of the oxide layer near the bottom of the gate electrode, so that the short circuit problem between the one gate structure and the source and drain regions on both sides of the one gate structure can be avoided. Therefore, the subsequently formed stress layer can have an improved effect to apply a compressive stress to the channel region of the PMOS structure, thereby improving the performance of the semiconductor device.

Referring to FIGS. 5-17, cross sectional structures of an exemplary semiconductor device corresponding to certain stages of an exemplary fabricating process are shown in consistent with some embodiments of the disclosed subject matter.

Figure 5:
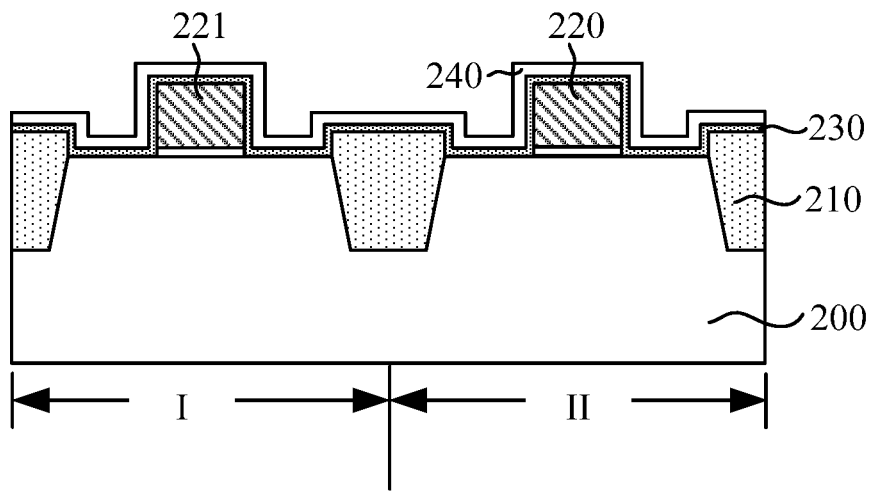
FIGS. 5-17 illustrate cross sectional structures of an exemplary semiconductor device corresponding to certain stages of an exemplary fabricating process consistent with some embodiments of the disclosed subject matter.

As illustrated in FIG. 5, a semiconductor substrate 200 can be provided (step 1810). The semiconductor substrate 200 can include a first region I used for forming an NMOS, and a second region II used for forming a PMOS. The first region I and the second region II are adjacent to each other.

A material of the semiconductor substrate 200 may be silicon, germanium, silicon germanium, silicon carbide, gallium arsenide or indium gallium. In some embodiments, the semiconductor substrate 200 can be a silicon substrate on an insulator, or a germanium substrate on an insulator. In one embodiment, the semiconductor substrate 200 is a silicon substrate.

It should be noted that, isolation structures 210 can be formed in the semiconductor substrate 200. In some embodiments, the isolation structures 210 may be a shallow trench isolation structure. In some other embodiments, the isolation structures 210 are not limited to include a shallow trench isolation structure. The isolation structures 210 can be used to achieve mutual isolations between devices.

Specifically, a process for forming the isolation structures 210 can includes the following steps. Firstly, the semiconductor substrate 200 can be etched to form isolation trenches (not shown in the figures) in the semiconductor substrate 200. Then, the isolation trenches can be filled with an isolation material. Next, the isolation material can be planarized to forming the isolation structures 210.

The isolation material may be a silicon oxide material. The process of filling silicon oxide material into the isolation trenches may be a chemical vapor deposition (CVD) method or a physical vapor deposition (PVD) method, such as a flow chemical vapor deposition (FCVD) process, a plasma enhanced chemical vapor deposition process, or a high aspect ratio chemical vapor deposition process (HARP).

In one embodiment, the isolation trenches are filled with silicon oxide material by using a high aspect ratio chemical vapor deposition process (HARP). As such, the formed isolation structures 210 can be uniformly dense and void-free, with desirable isolation effects. The planarization process can be a chemical mechanical polishing process. The etching process can be an anisotropic dry etching process.

Still referring to FIG. 5, gate structures can be formed on the semiconductor substrate 200 (step 1820). Specifically, a first gate structure 221 can be formed on the surface of the semiconductor substrate 200 in the first region I, and a second gate structure 220 can be formed on the surface of the semiconductor substrate 200 in the second region II.

Figure 6:
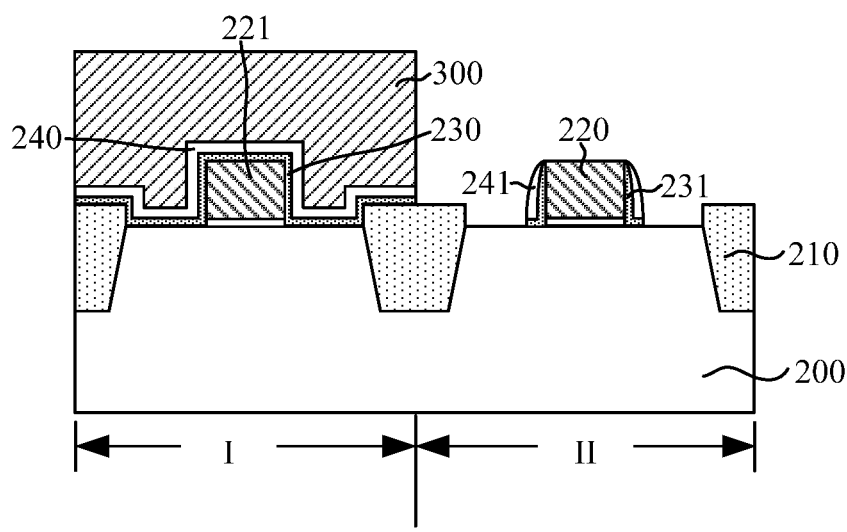

Referring to FIGS. 5 and 6, after forming the gate structures, a first dielectric layer can be formed conformally covering the semiconductor substrate 200, the first gate structure 221, and the second gate structure 220. The first dielectric layer on the surface of the semiconductor substrate 200 in the second region II, and on top of the second gate structure 220 can be etched to form first sidewalls covering the sidewall surfaces of the second gate structure 220.

In some embodiments, the first dielectric layer may have a single-layer structure, such as a silicon oxide film. In some other embodiments, the first dielectric layer may have a stacked structure, such as a double-layer structure including a silicon oxide film and a nitride silicon film, or a three-layer structure including a silicon oxide film, a silicon nitride film, and a silicon oxide film.

In one embodiment, as shown in FIG. 5, the first dielectric layer includes a silicon oxide film 230 and a silicon nitride film 240. A thickness of the silicon oxide film 230 can be in a range from 20 Å to 30 Å. A thickness of the silicon nitride film 240 can be in a range from 120 Å to 130 Å. Accordingly, the first sidewalls also have a double-layer structure including a silicon oxide layer 231 and a silicon nitride layer 241, as illustrated in FIG. 6.

Specifically, a process for forming the first sidewalls can include the following steps. After forming the first dielectric layer that conformally on the semiconductor substrate 200, the first gate structure 221, and the second gate structure 220, a first patterned mask layer 300 can be formed on the surface of the semiconductor substrate 200. The first patterned mask layer 300 can cover the first region I and expose the second region II. Using the first patterned mask layer 300 as a mask, the surface of the semiconductor substrate 200 in the second region II and the first dielectric layer on top of the second gate structure 220 can be etched to form the first sidewalls including the silicon oxide layer 231 and the silicon nitride layer 241 on the sidewall surface of the second gate structure 220.

In one embodiment, a material of the first patterned mask layer 300 can be a photoresist. After forming the first sidewalls, the first patterned mask 300 can be removed by using a wet de-gelling process or an ashing process.

Figure 7:
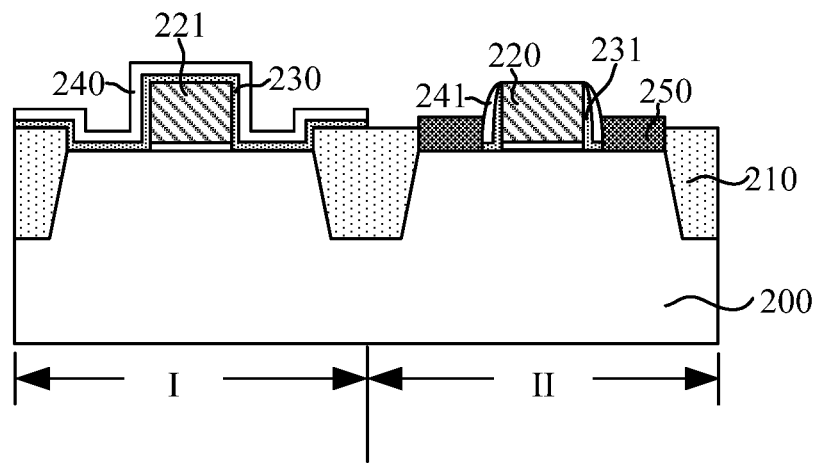

Referring to FIG. 7, an epitaxial substrate layer 250 can be formed on the semiconductor substrate 200 on both sides of the second gate structure 220 (step 1830).

In a subsequent etching process, trenches can be formed in the epitaxial substrate layer 250 and the semiconductor substrate 200 by etching the epitaxial layer 250 and the semiconductor substrate 200 on both sides of the second gate structure 220. The second region II of the semiconductor substrate 200 is used to form a PMOS device. The trenches formed in the epitaxial substrate layer 250 and the semiconductor substrate 200 on both sides of the second gate structure 220 have a Sigma "Σ" shape.

Specifically, after the etching process, the first dielectric layer on top of the second gate structure 220 in the second region II can be removed, and the surface of semiconductor substrate 200 in the second region II on both sides of the second gate structure 220 can be exposed. Then, the epitaxial substrate layer 250 can be formed on the exposed surface of the semiconductor substrate 200 in the second region II on both sides of the second gate structure 220.

In one embodiment, the surface of the epitaxial substrate layer 250 is higher than the surface of the isolation structures 210. In some embodiments, a thickness of the epitaxial substrate layer 250 can be in a range from 10 Å to 1,000 Å. Note that, the thickness of the epitaxial substrate layer 250 cannot be too thick nor too thin.

When the thickness of the epitaxial substrate layer 250 is too thick, it is difficult to subsequently form Sigma shaped trenches in the epitaxial substrate layer 250 and the semiconductor substrate 200 corresponding to the PMOS device. Since the Sigma shaped trenches are used to form a stress layer in a subsequent process and the stress layer serves as a source and drain regions for the semiconductor device, an over coated epitaxial substrate layer 250 can adversely affects the quality of the source and drain regions of the semiconductor device. Further, the oxide layer on the bottom of the second gate structure 220 can be susceptible to loss during the subsequent etching process for forming the Sigma shaped trenches. Therefore, a short circuit may be easily caused between the second gate structure 220 and the subsequently formed source and drain regions, which in turn affects the performance and yield of the semiconductor device.

When the thickness of the epitaxial substrate layer 250 is too thin, the subsequently formed Sigma shaped trenches located in the semiconductor substrate 200 may have an over deep depth. Since the Sigma shaped trenches are used to form a stress layer in a subsequent process and the stress layer serves as source and drain regions for the semiconductor device, the insufficiently coated epitaxial substrate layer 250 can adversely affects the performance and yield of the semiconductor device.

In various embodiments, a material of the epitaxial substrate layer 250 may be silicon, germanium, silicon germanium, silicon carbide, gallium arsenide or indium gallium. In one embodiment, the material of the epitaxial substrate layer 250 is silicon.

In some embodiments, the epitaxial substrate layer 250 can be formed by using an epitaxial chemical vapor deposition growth process including the following parameters. A processing temperature of the epitaxial chemical vapor deposition growth process can be in a range from 500° C. to 950° C. A processing time of the epitaxial chemical vapor deposition growth process can be in a range from 10 s to 11,000 s. A reaction chamber pressure of the epitaxial chemical vapor deposition growth process can be in a range from 5 Torr to 1,000 Torr. A pretreatment gas for epitaxially forming the epitaxial substrate layer 250 can be hydrogen gas, and reaction gases for epitaxially forming the epitaxial substrate layer 250 can be hydrogen chloride, dichlorosilane, silane, or any suitable mixture thereof.

Note that, when the process temperature is too high or too low, it is difficult to form the film material required by process based on the set processing time and the reaction chamber pressure conditions, and it is difficult to ensure that the thickness of the formed epitaxial substrate layer 250 satisfies the target thickness range. Therefore, the processing temperature needs to be controlled within the range between 500° C. and 950° C. Accordingly, in order to form the epitaxial substrate layer 250 that satisfies the target thickness range and to ensure that the material of the epitaxial substrate layer 250 is a film material required by the process, the processing time needs to be controlled within the range between 10 s to 11,000 s, and the reaction chamber pressure needs to be controlled within the range between 5 Torr and 1,000 Torr.

Figure 8:
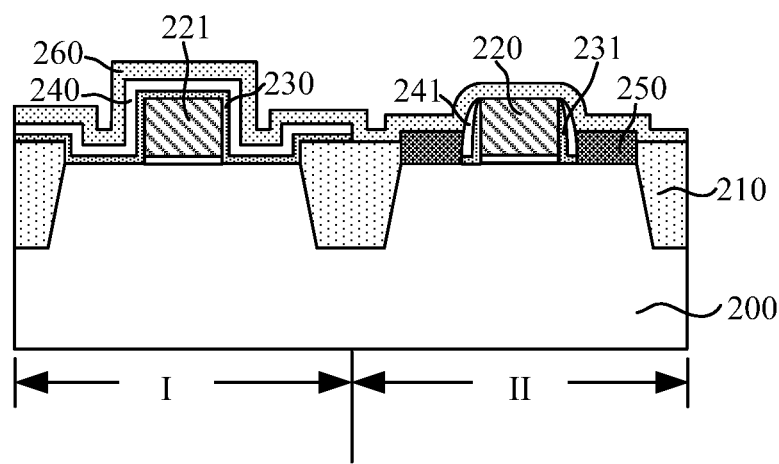

Referring to FIG. 8, a hard mask layer 260 can be formed conformally covering the epitaxial substrate layer 250, the second gate structure 220, and the semiconductor substrate 200 (step 1840).

Specifically, the hard mask layer 260 can be conformally coated on the first dielectric layer in the first region I, the epitaxial substrate layer 250, the second gate structure 220 with the first sidewalls formed, and the semiconductor substrate 200.

By adjusting a thickness of the hard mask layer 260, a depth and a cross-sectional area of the subsequently formed Sigma shaped trenches can be controlled. In some embodiments, the thickness of the hard mask layer 260 can be in a range from 20 Å to 300 Å. Note that, the thickness of the epitaxial substrate layer 250 cannot be too thick nor too thin.

When the thickness of the hard mask layer 260 is too thick, the subsequently formed Sigma shaped trenches in the epitaxial substrate layer 250 and the semiconductor substrate 200 may have a too small opening, and the cross-sectional area is also affected. Since the Sigma shaped trenches are used to form a stress layer in a subsequent process and the stress layer serves as source and drain regions for the semiconductor device, an over coated hard mask layer 260 can adversely affect the quality of the source and drain regions of the semiconductor device.

When the thickness of the hard mask layer 260 is too thin, the subsequently formed Sigma shaped trenches located in the semiconductor substrate 200 may have an oversized opening. Accordingly, an angle between the sidewall of the Sigma shaped trenches close to the bottom semiconductor substrate 200 and the surface of the semiconductor substrate 200 can be relatively large. Thus, the oxide layer on the bottom of the second gate structure 220 can be susceptible to loss during the subsequent etching process for forming the Sigma shaped trenches. Therefore, a short circuit may be easily caused between the second gate structure 220 and the subsequently formed source and drain regions, which in turn affects the performance and yield of the semiconductor device.

Specifically, the hard mask layer 260 can be formed by using a chemical vapor deposition process. The hard mask layer 260 can include one or more of an oxide layer, a nitride layer, an oxynitride layer, and an amorphous carbon. The oxide layer may include borophosphosilicate glass (BPSG), phosphosilicate glass (PSG), tetraethylorthosilicate (TEOS), undoped silicon glass (USG), spin-on-glass (SOG), high density plasma (HDP) and/or spin-on dielectric (SOD). The nitride layer may include a silicon nitride ($Si_3N_4$) layer. The nitride oxide layer may include a silicon oxynitride (SiON) layer. In one embodiment, the hard mask layer 260 is a silicon nitride layer.

Figure 9:
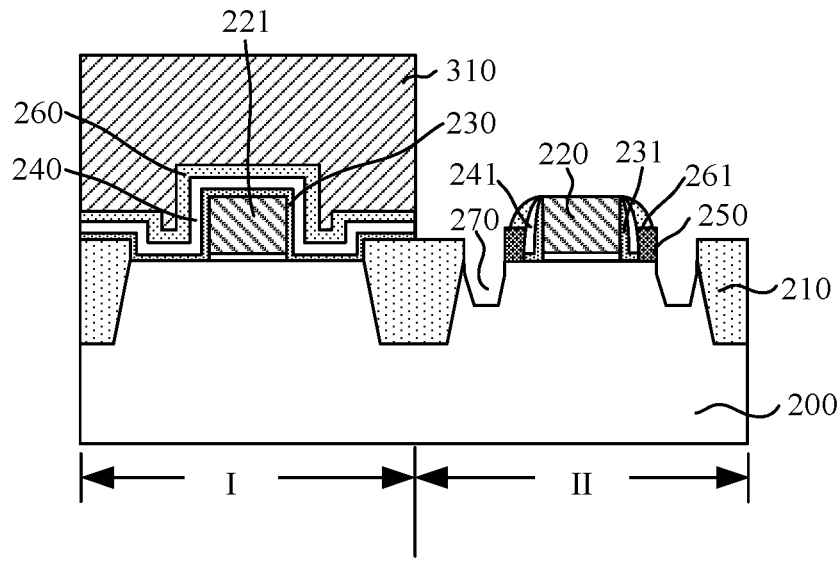

Referring to FIG. 9, the hard mask layer 260 can be etched to form a hard mask sidewall layer 261 on the sidewall surfaces of the second gate structure 220 (step 1850).

The hard mask sidewall layer 261 can serve as a mask layer for a subsequent etching process for forming trenches in the epitaxial substrate layer 250 and the semiconductor substrate 200.

Specifically, a second patterned mask layer 310 can be formed on the surface of the semiconductor substrate 200.

The second patterned mask layer 310 can cover the first region I and expose the second region II. Using the hard mask layer 260 as a mask, a plasma dry etching process can be performed to etch the exposed hard mask layer 260 in the second region II, and to form the hard mask sidewall layer 261 on the sidewall surfaces of the second gate structure 220.

It should be noted that, since the hard mask layer 260 conformally covers the second gate structure 220 and the epitaxial substrate layer 250, after the etching process, a portion of the hard mask layer 260 on top of the second gate structure 220 and the epitaxial substrate layer 250 can be removed. The remaining portion of the hard mask layer 260 forms the hard mask sidewall layer 261 on the sidewall surfaces of the second gate structure 220 and on the epitaxial substrate layer 250.

In one embodiment, a material of the second patterned mask layer 310 is photoresist. After the etching process for forming of the hard mask sidewall layer 261, the second patterned mask layer 310 can be retained.

Figure 10:
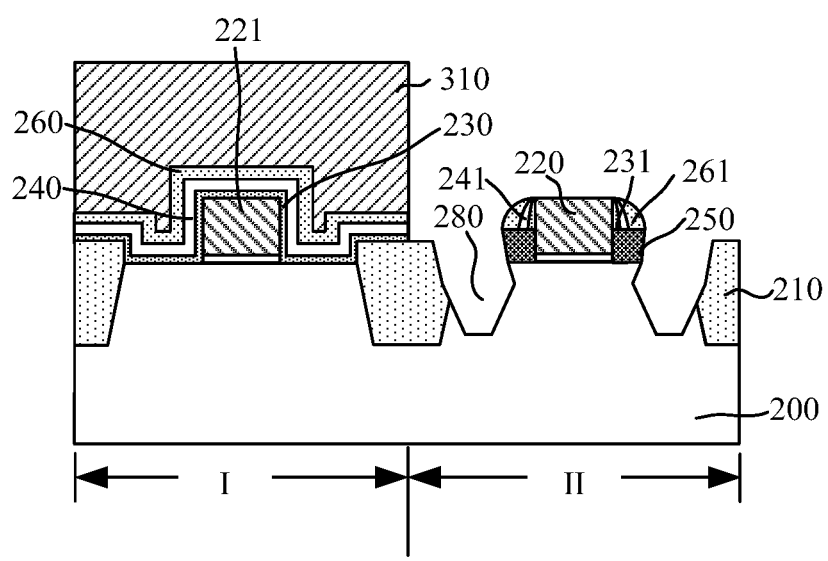

Referring to FIGS. 9 and 10, using the hard mask sidewall layer 261 as a mask, the epitaxial substrate layer 250 and the semiconductor substrate 200 can be etched to form trenches 280 on both sides of the second gate structure 220 (step 1860).

Specifically, the process for forming the trenches 280 on both sides of the second gate structure 220 can include the following steps. Firstly, as shown in FIG. 9, by using the second patterned mask layer 310 and the hard mask sidewall layer 261 as masks, a first etching process can be performed to sequentially etch the epitaxial substrate layer 250 and the semiconductor substrate 200 in the second region II to form initial openings 270 in the epitaxial substrate layer 250 and the semiconductor substrate 200 on both sides of the second gate structure 220. Next, as shown in FIG. 10, a second etching process can be performed to etch the initial openings 270 to form the trenches 280 in the epitaxial substrate layer 250 and the semiconductor substrate 200 on both sides of the second gate structure 220. Then, the second patterned mask layer 310 can be removed.

It should be noted that, the second region II is used for forming the PMOS device, and therefore the trenches 280 can have a Sigma "Σ" shape.

In one embodiment, the first etching process can be a plasma dry etching process including the following processing parameters. The etching gas can include one or more of gases of $CF_4$, $CH_3F$, HBr, $NF_3$, $Cl_2$, $O_2$ and $N_2$. The carrier gas can include Ar and/or He. A gas pressure of the reaction chamber can be in a range from 2 mtorr to 100 mtorr. A bias voltage can be in a range from 50V to 250V. A processing temperature can be in a range from 30° C. to 100° C. And a processing time can be in a range from 3 s to 20 s.

After forming the initial opening 270, a portion of the epitaxial substrate layer 250 close to the isolation structures 210 can be removed. Under the covering of the hard mask sidewall layer 261, another portion of the partial epitaxial layer 250 below the hard mask sidewall layer 261 can be retained. In some other embodiments, the retained portion of the epitaxial substrate layer 250 may include a portion of the epitaxial substrate layer 250 adjacent to the isolation structure 210 (not shown), and a portion of the epitaxial substrate layer 250 below the hard mask sidewall layer 261.

In one embodiment, the second etching process can be an anisotropic wet etching process. An etching liquid used in the anisotropic wet etching process includes a tetramethyl-ammonium hydroxide solution. A processing temperature can be in a range from 20° C. to 120° C. A processing time can be in a range from 20 s to 500 s.

It should be noted that, the shape of the initial openings 270 is a transitional shape of the trenches 280. During the anisotropic wet etching process, since the silicon material has a high etch selectivity, the initial openings 270 as shown in FIG. 9 can be etched to form Sigma "Σ" shaped trenches 280 in the epitaxial substrate layer 250 and the semiconductor substrate 200 on both sides of the second gate structure 220. A depth of the trenches 280 is larger than a depth of the initial openings 270. A cross-sectional area of the trenches 280 is greater than a cross-sectional area of the initial opening 270.

During the wet etching process to form the trenches 280, a portion of the epitaxial substrate layer 250 and a portion the isolation structures 210 on both sides of the second gate structure 220 can be removed. After forming the trenches 280, the second patterned mask layer 310 can be removed by using a wet de-gelling process or an ashing process.

Figure 11:
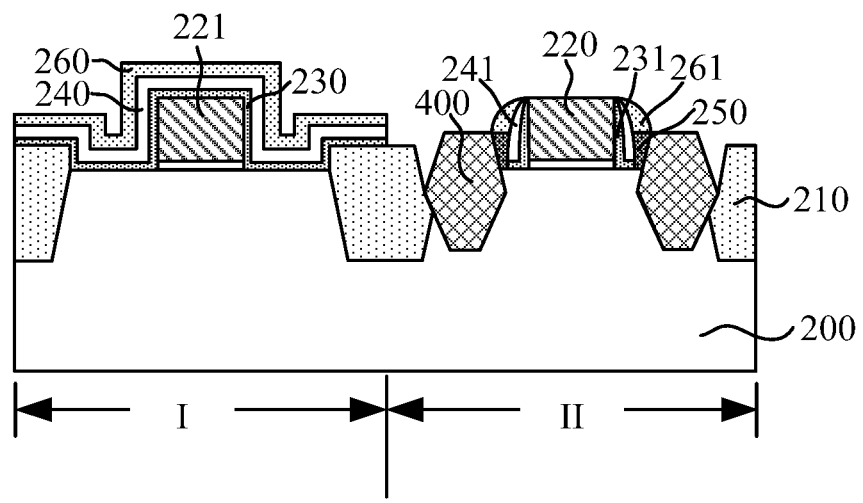

Referring to FIG. 11, a stress layer 400 can formed in the trenches 280 (step 1870). Specifically, after forming the trenches 280, a stress material can be filled into the trenches 280 to form the stress layer 400.

The stress layer 400 is made of a germanium silicon material or a boron-containing germanium silicon material. Since the surface of the epitaxial substrate layer 250 is higher than the surface of the isolation structures 210, the surface of the stress layer 400 is correspondingly higher than the surface of the isolation structures 210.

In one embodiment, a material of the stress layer 400 is germanium silicon. A process for forming the stress layer 400 can be an epitaxial chemical vapor deposition growth process including the following processing parameters. A processing temperature can be in a range from 500° C. to 950° C. A processing time can be in a range from 10 s to 11,000 s. A reaction chamber pressure can be in a range from 5 Torr to 1,000 Torr. A pretreatment gas for epitaxially forming the stress layer 400 can be hydrogen. And a reaction gas for epitaxially forming the stress layer 400 can be hydrogen chloride, dichlorosilane, silane, or a mixture gas thereof.

When the processing temperature is too high or too low, it is difficult to form the film material required for the process based on the set processing time and the reaction chamber pressure conditions, and it is difficult to ensure that the thickness of the formed stress layer 400 can satisfy the target thickness requirement. Thus, the processing temperature need to be controlled between 500° C. and 950° C. Accordingly, in order to form the stress layer 400 that satisfies the target thickness range and to ensure that the material of the stress layer 400 is a film material required by the process, the processing time needs to be controlled within the range between 10 s to 11,000 s, and the reaction chamber pressure needs to be controlled within the range between 5 Torr and 1,000 Torr.

By applying the appropriate stress to the channel region of the PMOS region through the stress layer 400, the hole mobility can be increased, thereby improving the performance of the semiconductor device.

In the disclosed fabricating method, before forming the stress layer 400, an epitaxial substrate layer 250 can be formed on the semiconductor substrate 200 on both sides of the second gate structure 220. The epitaxial substrate layer 250 can be used as a part of the substrate of the PMOS device such that the substrate of the PMOS device can be raised up. By adjusting the thickness of the epitaxial substrate layer 250, the height of the substrate of the PMOS device to be raised can be controlled.

Further, a hard mask sidewall layer 261 can be formed on the sidewall surfaces of the second gate structure 220. By using the hard mask sidewall layer 261 as a mask, the epitaxial substrate layer 250 and the semiconductor substrate 200 can be etched to form Sigma shaped trenches 280 on both sides of the second gate structure 220.

During the etching process for forming the trenches 280, the epitaxial substrate layer 250 under the hard mask sidewall layer 261 can be retained, so that the opening size of the top portion of the formed trenches 280 can be relatively small. Accordingly, the angles between the sidewalls of the trenches 280 close to the epitaxial substrate layer 250 and the substrate surface can be relatively small. As such, the etching process for forming the Sigma shaped trenches 280 can cause less loss of the oxide layer near the bottom of the gate electrode, so that the short circuit problem between the second gate structure 220 and the source and drain regions on both sides of the second gate structure 220 can be avoided. Therefore, the stress layer 400 can have an improved effect to apply a compressive stress to the channel region of the PMOS structure, thereby improving the performance of the semiconductor device.

Figure 12:
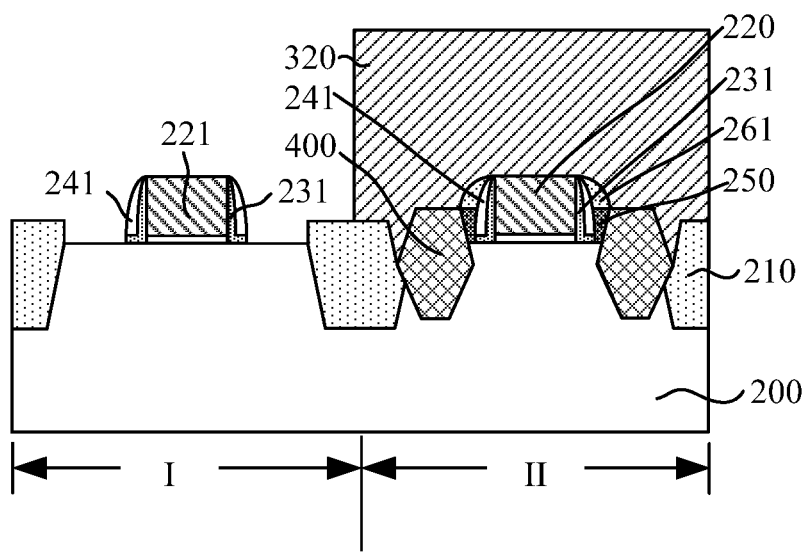

Referring to FIG. 12, the hard mask layer 260 (shown in FIG. 11) on the surface of the first dielectric layer in the first region I can be removed by etching. Then the first dielectric layer in the first region I on the surface of the semiconductor substrate 200 and on top of the first gate structure 221 can be removed by etching. A first sidewalls (not shown in the figures) that covers the sidewall surfaces of the first gate structure 221 can be formed.

In one embodiment, as shown in FIG. 11, the first dielectric layer includes a silicon oxide film 230 and a silicon nitride film 240. Correspondingly, the first sidewalls covering the sidewall surfaces of the first gate structure 221 also have a double-layer structure including a silicon oxide layer 231 and a silicon nitride layer 241.

Specifically, a process for forming the first sidewalls covering the sidewall surfaces of the first gate structure 221 can include the following steps. Firstly, a third patterned mask layer 320 can be formed on the surface of the semiconductor substrate 200. The third patterned mask layer 320 can cover the second region II and expose the first region I. By using the third patterned mask layer 320 as a mask, a plasma dry etching process can be performed to remove the hard mask layer 260 in the first region I. And the first dielectric layer on the e surface of the semiconductor substrate 200 in the first region I and on top of the gate structure 221 can be removed by etching to form the first sidewalls on the sidewall surfaces of the first gate structure 221.

In one embodiment, a material of the third patterned mask layer 320 is photoresist. After the first sidewalls are formed on the sidewall surfaces of the first gate structure 221, the third patterned mask layer 320 can be removed by using a wet de-gelling process or an ashing process.

Figure 13:
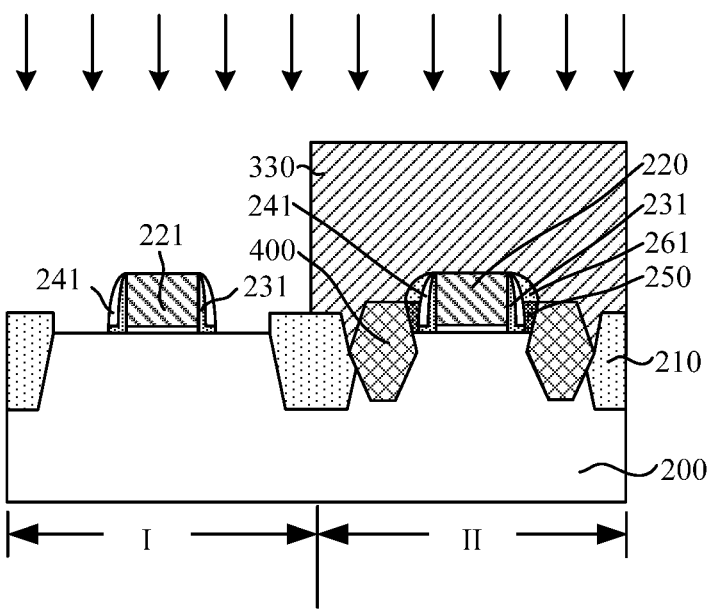

Referring to FIG. 13, after forming the first sidewalls covering the sidewall surfaces of the first gate structure 221, a first shallow doped ion region (not shown in the figures) can be formed in a semiconductor substrate 200 on both sides of the first gate structure 221.

Specifically, a fourth patterned mask layer 330 can be formed on the surface of the semiconductor substrate 200. The fourth patterned mask layer 330 can cover the second region II and expose the first region I. Using the fourth patterned mask layer 330 as a mask, a shallow doping ion implantation process can be performed to the first region I to form the first shallow doped ion region in the semiconductor substrate 200 on both sides of the first gate structure 221. After that, the fourth patterned mask layer 330 can be removed by using a wet de-gelling process or an ashing process.

In one embodiment, the first region I is used to form an NMOS. That is, the main dopant ions in the first lightly doped region are N-type ions. The N-type ions can be phosphorus ions, arsenic ions, or antimony ions. An implanted ion energy can be in a range from 0.2 KeV to 10 KeV. And an implanted ion dose can be in a range from 2E14 atoms per square centimeter to 3E15 atoms per square centimeter.

Figure 14:
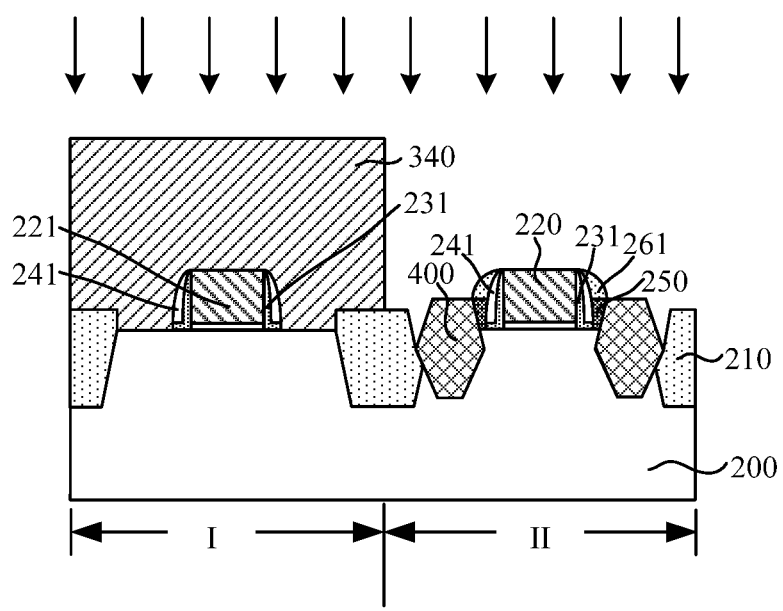

Referring to FIG. 14, a second shallow doped ion region (not shown in the figures) can be formed in the semiconductor substrate 200 on both sides of the second gate structure 220.

Specifically, a fifth patterned mask layer 340 can be formed on the surface of the semiconductor substrate 200. The fifth patterned mask layer 340 can cover the first region I and expose the second region II. Using the fifth patterned mask layer 340 as a mask, a shallow doping ion implantation process can be performed to the second region II to form the second shallow doped ion region in the semiconductor substrate 200 on both sides of the second gate structure 220. After that, the fifth patterned mask layer 340 can be removed by using a wet de-gelling process or an ashing process.

It should be noted that, the stress layer 400 is formed in the epitaxial substrate layer 250 and the semiconductor substrate 200, and the second shallow doping ion region is located in the stress layer 400 and the semiconductor substrate 200.

In one embodiment, the second region II is used to form a PMOS. That is, the main dopant ions of the second lightly doped region are P-type ions. The P-type ions can be boron ions, gallium ions, or indium ions. An implanted ion energy can be in a range from 4 KeV to 50 KeV, and an implanted ion dose can be in a range from 6E12 atoms per square centimeter to 6E13 atoms per square centimeter.

Figure 15:
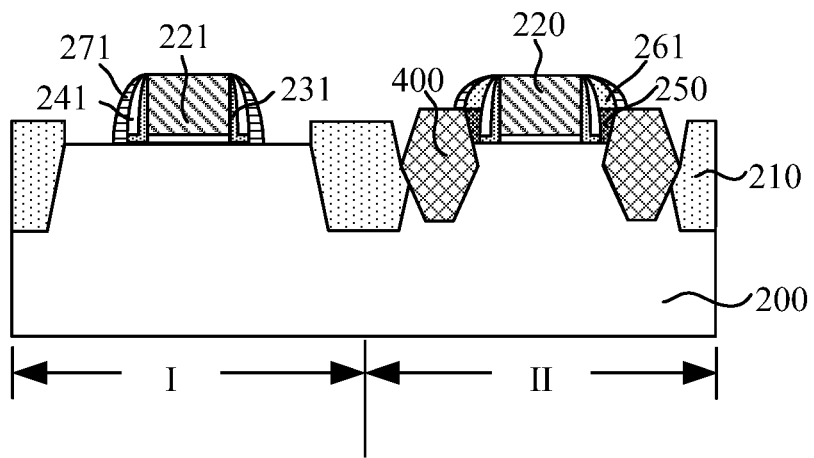

Referring to FIG. 15, second sidewalls 271 covering the surfaces of the first sidewalls (not shown in the figures) can be formed in the first region I and the second region II.

Specifically, a process for forming the second sidewalls 271 can include the following steps. Firstly, a second dielectric layer (not shown in the figures) can be formed to conformally cover the first sidewalls, the stress spacer layer 400, the hard mask sidewall layer 261, the first gate structure 221, the second gate structure 220, and the semiconductor substrate 200. Then a maskless etching process can be performed to remove a portion of the second dielectric layer on the surface of the semiconductor substrate 200, the top surface of the first gate structure 221, the top surface of the second gate structure 220, and a portion of the top surface of the stress layer. The remaining portion of the second dielectric layer on the surfaces of the first sidewalls forms the second sidewalls 271.

It should be noted that, a hard mask sidewall layer 261 can be formed on the surfaces of the first sidewalls in the second region II, so the second sidewalls 271 can be formed on the surfaces of the hard mask sidewall layer 261.

In on embodiment, the maskless etching process can be a plasma dry etching process.

In some embodiments, the second dielectric layer may have a single-layer structure, such as a silicon oxide film. Accordingly, the second sidewalls 271 can be a silicon oxide layer. In some other embodiments, the second dielectric layer may have a stacked structure, such as a two-layer structure including a silicon oxide film and a silicon nitride film, or a three-layer structure including a silicon oxide film, a silicon nitride film and a silicon oxide film. Accordingly, the second sidewall spacer 271 may also have a stacked structure, such as a two-layer structure including a silicon oxide film and a silicon nitride film, or a three-layer structure including a silicon oxide film, a silicon nitride film and a silicon oxide film.

Figure 16:
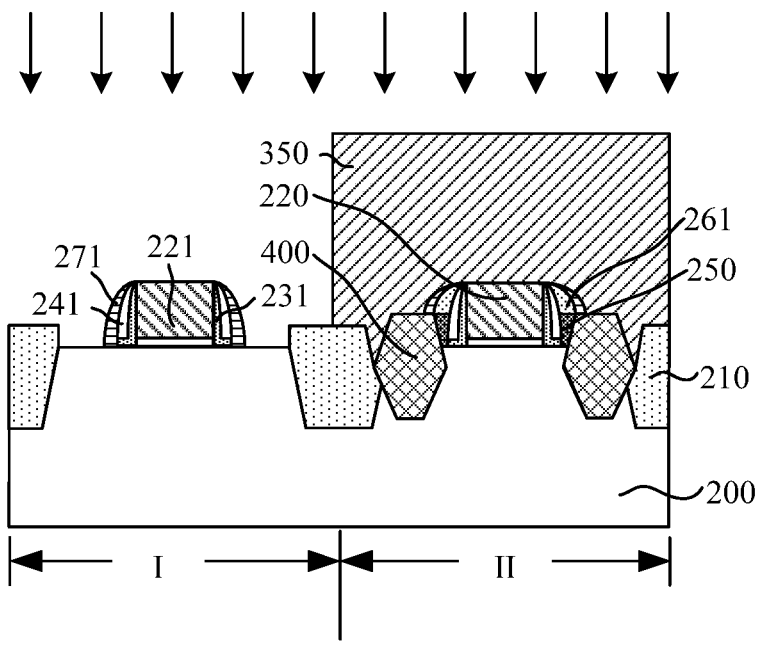

Referring to FIG. 16, after forming the second sidewalls 271 covering the surface of the first sidewalls (not labelled in the figures) in the first region I and the second region II, first source and drain regions (not shown in the figures) can be formed in the semiconductor substrate 200 on both sides of the first gate structure 221.

Specifically, a sixth patterned mask layer 350 can be formed on the surface of the semiconductor substrate 200. The sixth patterned mask layer 350 can cover the second region II and expose the first region I. Using the sixth patterned mask layer 350 as a mask, a heavily doped ion implantation process can be applied to the first region I to form first source and drain regions on both sides of the first gate structure 221. After forming the first source and drain regions, the sixth patterned mask layer 350 can be removed by using a wet de-gelling process or an ashing process.

In one embodiment, the first region I is used to form an NMOS. That is, the main dopant ions of the first source and drain regions are N-type ions, such as phosphorus ions, arsenic ions, or antimony ions. An implanted ion energy can be in a range from 1 KeV to 10 KeV, and an implanted ion dose can be in a range from 1E14 atoms per square centimeter to 5E15 atoms per square centimeter.

Figure 17:
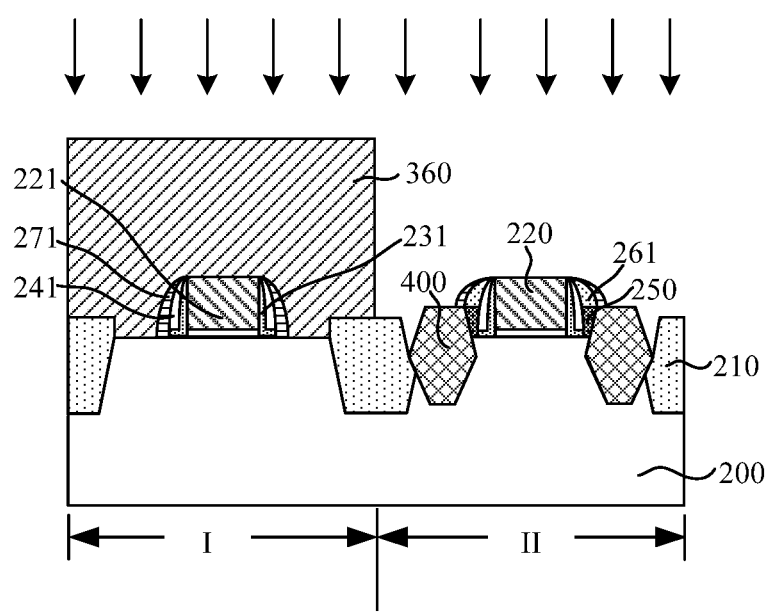

Referring to FIG. 17, second source and drain regions (not shown in the figures) can be formed in the semiconductor substrate 200 on both sides of the second gate structure 220.

Specifically, a seventh patterned mask layer 360 can be formed on the surface of the semiconductor substrate 200. The seventh mask layer 360 can cover the first region I and expose the second region II. Using the seventh patterned mask layer 360 as a mask, a heavily doped ion implantation process can be applied to the second region II to form second source and drain regions on both sides of the second gate structure 220. After forming the second source and drain regions, the seventh patterned mask layer 360 can be removed by using a wet de-gelling process or an ashing process.

In one embodiment, the second region II is used to form a PMOS. That is, the main dopant ions of the second source and drain regions are P-type ions, such as boron ions, gallium ions, or indium ions. An implanted ion energy can be in a range from 1 KeV to 10 KeV, and an implanted ion dose can be in a range from 6E12 atoms per square centimeter to 6E13 atoms per square centimeter.

It should be noted that, the stress layer 400 is formed in the epitaxial substrate layer 250 and the semiconductor substrate 200, and the second source and drain regions are located in the stress layer 400 and the semiconductor substrate 200.

Another aspect of the disclosed subject matter provides a semiconductor device. As illustrated in FIG. 15, the semiconductor device can include the following components.

The semiconductor device can include a semiconductor substrate 200, and gate structures including a first gate structure and a second gate structure on the semiconductor substrate 200.

An epitaxial substrate layer 250 can be located on the semiconductor substrate 200 on both sides of one gate structure selected from the first gate structure and the second gate structure. A thickness of the epitaxial substrate layer 250 can be less than a height of the gate structure.

A hard mask sidewall layer 261 can be located on the sidewall surfaces of the one gate structure. The hard mask sidewall layer 261 is located above the epitaxial substrate layer 250.

A stress layer 400 can be located in the epitaxial substrate layer 250 and the semiconductor substrate 200.

Specifically, the semiconductor substrate 200 can include a first region I for forming an NMOS and a second region II for forming a PMOS. In one embodiment, the first region I and the second region II can be adjacent to each other.

In one embodiment, the gate structures can include a first gate structure 221 on the semiconductor substrate 200 in the first region I, and a second gate structure 220 on the semiconductor substrate 200 in the second region II. The epitaxial substrate layer 250 is located on a semiconductor substrate 200 on both sides of the second gate structure 220. The hard mask sidewall layer 261 is located on sidewall surfaces of the second gate structure 220.

In one embodiment, the semiconductor device further includes isolation structures 210 located within the semiconductor substrate 200. The isolation structures 210 can be shallow trench isolation structures. The isolation structures 210 can be used to achieve mutual isolation between devices. In the second region II, the stress layer 400 is located between the isolation structures 210 and the second gate structure 220.

In one embodiment, a material of the epitaxial substrate layer 250 is silicon, a material of the hard mask sidewall layer 261 is silicon nitride, and a material of the stress layer 400 is germanium silicon or germanium silicon boron. A thickness of the epitaxial substrate layer 250 is in a range from 10 Å to 500 Å, and a thickness of the stress layer 400 is in a range from 200 Å to 1,000 Å.

In the disclosed semiconductor device, the epitaxial substrate layer 250 can be used as a part of the substrate of the PMOS device such that the substrate of the PMOS device can be raised up. By adjusting the thickness of the epitaxial substrate layer 250, the height of the substrate of the PMOS device to be raised can be controlled.

Therefore, when a compressive stress is applied to the channel region of the PMOS structure to increase the hole mobility, the oxide layer 231 near the bottom of the second gate structure 220 can be protected from the impact of the compressive stress. As such, the short circuit problem between the second gate structure 220 and the source and drain regions on both sides of the second gate structure 220 can be avoided, thereby improving the performance of the semiconductor device.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Accordingly, a semiconductor device and a fabricating method thereof are provided.

Although the disclosed subject matter has been described and illustrated in the foregoing illustrative embodiments, it is understood that one disclosure has been made only by way of example, and that numerous changes in the details of embodiment of the disclosed subject matter can be made without departing from the spirit and scope of the disclosed subject matter, which is only limited by the claims which follow. Features of the disclosed embodiments can be combined and rearranged in various ways. Without departing from the spirit and scope of the disclosed subject matter, modifications, equivalents, or improvements to the disclosed subject matter are understandable to those skilled in the art and are intended to be encompassed within the scope of one disclosure.

What is claimed is:

1. A method for fabricating a semiconductor device, comprising:
    providing a semiconductor substrate;
    forming a gate structure on the semiconductor substrate;
    forming isolation structures on both sides of the gate structure;
    forming an epitaxial substrate layer on the semiconductor substrate and in an opening formed by one side of the gate structure and a corresponding isolation structure;
    forming a hard mask layer conformally covering the epitaxial substrate layer, the gate structure and the semiconductor substrate;
    etching the hard mask layer to form a hard mask sidewall layer on sidewall surfaces of the gate structure and on the epitaxial substrate layer;
    using the hard mask sidewall layer as a mask to etch the epitaxial substrate layer and the semiconductor substrate to form trenches on both sides of the gate structure; and
    forming a stress layer in the trenches, wherein the stress layer is formed in the trenches formed by the sidewall of the isolation layer, the sidewall of the epitaxial substrate layer, and the surface of the substrate, and a top surface of the stress layer is coplanar with a top surface of the epitaxial substrate layer.

2. The method of claim 1, wherein:
    the semiconductor device is a PMOS; and
    the trenches have a Sigma shape.

3. The method of claim 1, wherein:
    a material of the epitaxial substrate layer is one of silicon, germanium, silicon germanium, silicon carbide, gallium arsenide, and indium gallium.

4. The method of claim 1, wherein:
    a process for forming the epitaxial substrate layer is an epitaxial chemical vapor deposition growth process.

5. The method of claim 4, wherein the epitaxial chemical vapor deposition growth process includes following parameters:
    a processing temperature in a range from 500° C. to 950° C.;
    a processing time in a range from 10 seconds to 11,000 seconds;
    a reaction chamber pressure in a range from 5 Torr to 1,000 Torr;
    and
    a reaction gas, for epitaxially forming the epitaxial substrate layer, including one of hydrogen chloride, dichlorosilane, silane, and a combination thereof.

6. The method of claim 1, wherein:
    a thickness of the epitaxial substrate layer is in a range from 10 Å to 1,000 Å.

7. The method of claim 1, wherein:
    a material of the hard mask layer is silicon nitride.

8. The method of claim 1, wherein:
    a thickness of the hard mask layer is in a range from 20 Å to 300 Å.

9. The method of claim 1, wherein:
    a material of the stress layer is a germanium silicon material, or a boron-containing germanium silicon material.

10. The method of claim 1, wherein:
    a process for forming the stress layer is an epitaxial chemical vapor deposition growth process.

11. The method of claim 10, wherein the epitaxial chemical vapor deposition growth process includes following parameters:
    a processing temperature in a range from 500° C. to 950° C.;
    a processing time in a range from 10 seconds to 11,000 seconds;
    a reaction chamber pressure in a range from 5 Torr to 1,000 Torr;
    and
    a reaction gas, for epitaxially forming the stress layer, including one of hydrogen chloride, dichlorosilane, silane, and a combination thereof.

12. The method of claim 1, wherein:
    a thickness of the stress layer is in a range from 200 Å to 1,000 Å.

13. The method of claim 1, wherein etching the epitaxial substrate layer and the semiconductor substrate to form trenches comprises:
    using the hard mask sidewall layer as a mask, performing a first etching process to sequentially etch the epitaxial substrate layer and the semiconductor substrate to form initial openings in the epitaxial substrate layer and the semiconductor substrate on both sides of the gate structure; and
    performing a second etching process to etch the isolation structures, the semiconductor substrate, and the epitaxial layer in the initial openings to form the trenches in the epitaxial substrate layer and in the semiconductor substrate on both sides of the gate structure.

14. The method of claim 13, wherein:
    the first etching process is a plasma dry etching process; and
    the second etching process is an anisotropic wet etching process.

15. The method of claim 1, wherein
    top surfaces of the epitaxial substrate layer is higher than the top surfaces of the isolation structures.

* * * * *